United States Patent [19]

Kazior et al.

[11] Patent Number: 4,807,022

[45] Date of Patent: Feb. 21, 1989

[54] SIMULTANEOUS FORMATION OF VIA HOLE AND TUB STRUCTURES FOR GAAS MONOLITHIC MICROWAVE INTEGRATED CIRCUITS

[75] Inventors: Thomas E. Kazior, Sudbury; Mark S. Durschlag, Natick, both of Mass.

[73] Assignee: Raytheon Company, Lexington, Mass.

[21] Appl. No.: 44,684

[22] Filed: May 1, 1987

[51] Int. Cl.⁴ .................. H01L 23/34; H01L 27/04; H01L 21/302
[52] U.S. Cl. ........................... 357/81; 357/15; 357/22; 357/55; 357/68; 357/71; 437/203; 437/902
[58] Field of Search ............... 357/22 H, 55, 81, 22 J, 357/22 K, 68, 71, 65; 156/654, 647, 656, 657, 659.1, 662; 437/203, 902

[56] References Cited

U.S. PATENT DOCUMENTS

| | | | |
|---|---|---|---|
| 3,509,433 | 4/1970 | Schroodir | 357/49 |
| 3,823,352 | 7/1974 | Praniaux et al. | 357/15 |
| 3,986,196 | 10/1976 | Decker et al. | 357/22 H |
| 4,376,287 | 3/1983 | Sechi | 357/81 |
| 4,381,341 | 4/1983 | Przybysz et al. | 437/203 |
| 4,571,611 | 2/1986 | Kashiwagi | 357/81 |
| 4,601,096 | 7/1986 | Calviello | 357/22 H |
| 4,751,562 | 6/1988 | Yamamura | 357/22 H |

FOREIGN PATENT DOCUMENTS

| | | | |
|---|---|---|---|
| 52-38885 | 3/1977 | Japan | 357/81 |
| 59-123270 | 7/1984 | Japan | 357/55 |
| 59-114884 | 7/1984 | Japan . | |

*Primary Examiner*—William D. Larkins
*Attorney, Agent, or Firm*—Denis G. Maloney; Richard M. Sharkansky

[57] ABSTRACT

A method of simultaneously forming recesses for via holes and tub structures in a substrate is provided in a common etching step by defining a mask pattern for the via hole as a single aperture and by defining a mask pattern for the tub structure as a plurality of thin slots. The slots are chosen to have a smaller cross-sectional dimension than the corresponding dimension for the single aperture. Etchant brought into contact with the substrate will etch the substrate at a slower rate in the slots than in the single apertur such that the via hole will etch completely through the substrate whereas, the tub structure will be etched only partially through the substrate. Conductive material is provided in the tub structure and via hole, and a layer of conductive material is disposed thereover, to provide a heat sink/ ground plane conductor. Electrical contact is provided between the frontside of the substrate and the heat sink/-ground plane conductor through the via hole, whereas a low thermal impedance path is provided through the tube structure between a heat dissipating element supported on the frontside of the substrate and the heat sink/ground plane conductor.

6 Claims, 5 Drawing Sheets

SIMULTANEOUS FORMATION OF VIA HOLE AND TUB STRUCTURES FOR GAAS MONOLITHIC MICROWAVE INTEGRATED CIRCUITS

BACKGROUND OF THE INVENTION

This invention relates generally to semiconductor circuits and more particularly to fabrication of features within semiconductors circuits.

As it is known in the art, gallium arsenide is a preferred material for formation of high operating frequency and high speed monolithic integrated circuits. In particular, with so-called monolithic microwave integrated circuits, a gallium arsenide substrate supports an active layer for formation of field effect transistors and other circuit devices including passive components and transmission lines. These circuits may be classified as analog type circuits and, therefore, can encompass the various types of analog circuits including high power circuits such as power amplifiers. For high power circuits an individual heat dissipating device such as a field effect transistor during operation can often have a channel temperature which exceed 200° C. Such a high temperature influences the performance, the properties, and the reliability of the device. With these high temperatures, heat must be efficiently removed from the device in order to minimize the risk of premature failure of the device.

Typically, the backside, that is the side of the gallium arsenide substrate not having formed thereon the active devices, is provided with a ground plane which is typically formed from a highly thermally and electrically conductive material such as gold. Gallium arsenide, however, has a relatively low thermal conductivity when compared to the thermal conductivity of gold. Therefore, it would be desirable from a device heat sinking perspective to provide a relatively thin substrate of gallium arsenide, to thereby better effectively remove heat from gallium arsenide circuits. On the other hand, gallium arsenide is also a relatively fragile and mechanically weak material. That is, from the perspective of handling of the devices manufactured from gallium arsenide, a relatively thick substrate is desirable to increase the mechanical handling capability of circuits formed from the gallium arsenide.

Moreover, since in many analog circuits, the gallium arsenide substrate acts as a dielectric for strip conductor type transmission lines, for example, the thickness of the gallium arsenide substrate is also a consideration from a device properties perspective.

Therefore, considerations other than the effectiveness of removing heat from the heat dissipating elements often dictate the thickness of the gallium arsenide substrate. A solution to this problem has been to selectively thin a region of the substrate underlying the heat dissipating element to providing a region which can be filled with a conductive material and thus, reduce the thermal resistance between the heat dissipating element and the heat sink or backside conductive layer formed on the backside of the gallium arsenide substrate.

Generally, these circuits also employ so-called plated via hole structures which are provided to make electrical contact between the backside of the substrate and components formed or supported on the frontside of the substrate. These via holes are provided completely through the substrate, whereas the so-called tub structures are provided only partially through the substrate. Techniques for forming via holes and tub structures require two separate photolithographic or lithographic steps and two separate etching steps. Problems arise from performing the second lithographic and etching step on the backside of the wafer after the formation of either one of the via hole or tub structures due to the gross topological differences presented by the features already formed on the backside of the substrate. For example, it is often difficult to provide adequate resist step coverage over regions not to be etched. Therefore, erosion of the resist around the edges of these regions provides unwanted etching of the gallium arsenide during subsequent etching steps. Moreover, a technique which reduces the number of processing steps, should reduce the cost and improve the yield of such circuits.

SUMMARY OF THE INVENTION

In accordance with the present invention, a method of forming first and second recess portions in a substrate each recess having a different depth is provided. A masking layer is disposed over a substrate and patterned to provide first and second regions in said masking layer with a first region disposed over the location for the first recess being patterned to provide at least one exposed portion of said substrate, and the second region disposed over the location for said second recess being patterned to provide a plurality of separate, exposed portions of the substrate, with each one of said plurality of portion being smaller than the one exposed portion. An etchant is brought into contact with the exposed portions of the substrate to etch these regions of the substrate exposed through said first and second regions at least until the pattern etched through the plurality of separate, exposed portions overlaps in the etched portion of the substrate to provide the second recess, and said first region is etched to provide said first recess. With this particular arrangement, the first and second recesses formed in the substrate will have different depths, since the etch rate through the substrate is a function of the cross-sectional dimension of the features to be etched. The second recess is provided with a shallower depth than the first recess since the second recess has been etched through the pattern provided by the plurality of smaller separate, exposed portions of the substrate will etch slower than first recess etched through the pattern of the relatively larger exposed portion of the substrate. The separation of the plurality of exposed regions is chosen such that the regions etched into the substrate undercut one another thus causing these regions to overlap and form a recess. That is, the shallow recess is formed by merging a series of slots which are undercut through the etching process to provide the resulting shallow recess structure. Since the first region having the exposed portion of the substrate is etched through a relatively large pattern in the photoresist layer, the etched rate for the first patterned layer will be higher than the etched rate for the plurality of spaced, smaller exposed areas. Accordingly, the first portion will etch substantially faster and thus, substantially deeper into the substrate than the second portion.

In accordance with a further aspect of the present invention, a method of forming a recessed tub structure in a substrate underlying a heat dissipating device supported on the frontside of the substrate, and a via hole disposed completely through the substrate is provided by forming a masking layer over a backside surface of the substrate and patterning the masking layer to provide first and second patterned regions, with the first and second patterned regions corresponding to the region of the recessed tub structure and the region of the via hole, respectively. The region of the recessed tub structure is patterned to provide a plurality of spaced, separate apertures in said masking layer which correspondingly expose underlying portions of said substrate. The second patterned region corresponding to the region of the via hole is patterned to provide at least one aperture in said masking layer exposing underlying portions of said substrate, with the dimensions of said one aperture being substantially larger than the corresponding dimensions of any one of the plurality of spaced apertures provided in the first patterned region. The substrate is then etched through said first and second patterned regions until the second patterned region etches completely through the substrate to provide the via hole through the substrate. With this particular arrangement, since the pattern provided to form the via hole has an aperture with dimensions substantially larger than the corresponding dimensions of any of the plurality of spaced apertures in the first pattern used to provide the tub structure, the portion of the substrate in the region of the via hole when brought into contact with an etchant will etch at a faster rate as a function of depth than the portion of the substrate in the region of the tub structure. Therefore, after the via hole is etched completely through the substrate, the substrate may be removed from the etchant and a tub structure will be provided having a recess which is etched only partially through the substrate. The simultaneous etching of the via hole and the tub structures will provide improved processing capabilities by eliminating a critical and difficult lithographic step used when the tub and via structures are formed individually.

Conductive material is disposed in the via hole and in the tub structure, and a conductive layer is disposed over the backside surface of the substrate to provide an electrically conductive path through the substrate and a low thermal impedance path between the heat dissipating element and the thermally conductive backside of the substrate. Accordingly, heat dissipating devices fabricated on the frontside of the substrate will have a relatively low thermal resistance path between the device and the conductive heat sink layer disposed on backside of the substrate. This arrangement will improve the reliability of the heat dissipating elements by making the heat dissipating elements conduct heat faster to the backside of the substrate.

In accordance with a further aspect of the present invention, a substrate has a pair of recesses each having different depths, with at least one of said recesses having a irregular nonplanar bottom surface portion. With this particular arrangement, a pair of recesses of different depths are simultaneously formed in a substrate. This will reduce the cost of fabrication of articles incorporating substrates having a pair of recesses disposed at different depths into the substrate.

In accordance with a further aspect of the present invention, a semiconductor circuit having at least one heat dissipating device supported on a substrate includes a hole disposed through said substrate provided to make electrical contact between a frontside of the substrate and a backside of the substrate on which is disposed a conductive plane, and a recess disposed through a portion of the backside of the substrate in a region thereof underlying the heat dissipating element with said recess having an irregular, nonplanar surface adjacent to said heat dissipating device. The recess underlying the heat dissipating device is filled with a thermally conductive material which is provided in thermal contact with the conductive plane disposed on the backside of the substrate.

BRIEF DESCRIPTION OF THE DRAWINGS

The foregoing features of this invention, as well as the invention itself, may be fully understood from the following detailed description of the drawings, in which.

DESCRIPTION OF THE PREFERRED EMBODIMENTS

Figure 1:
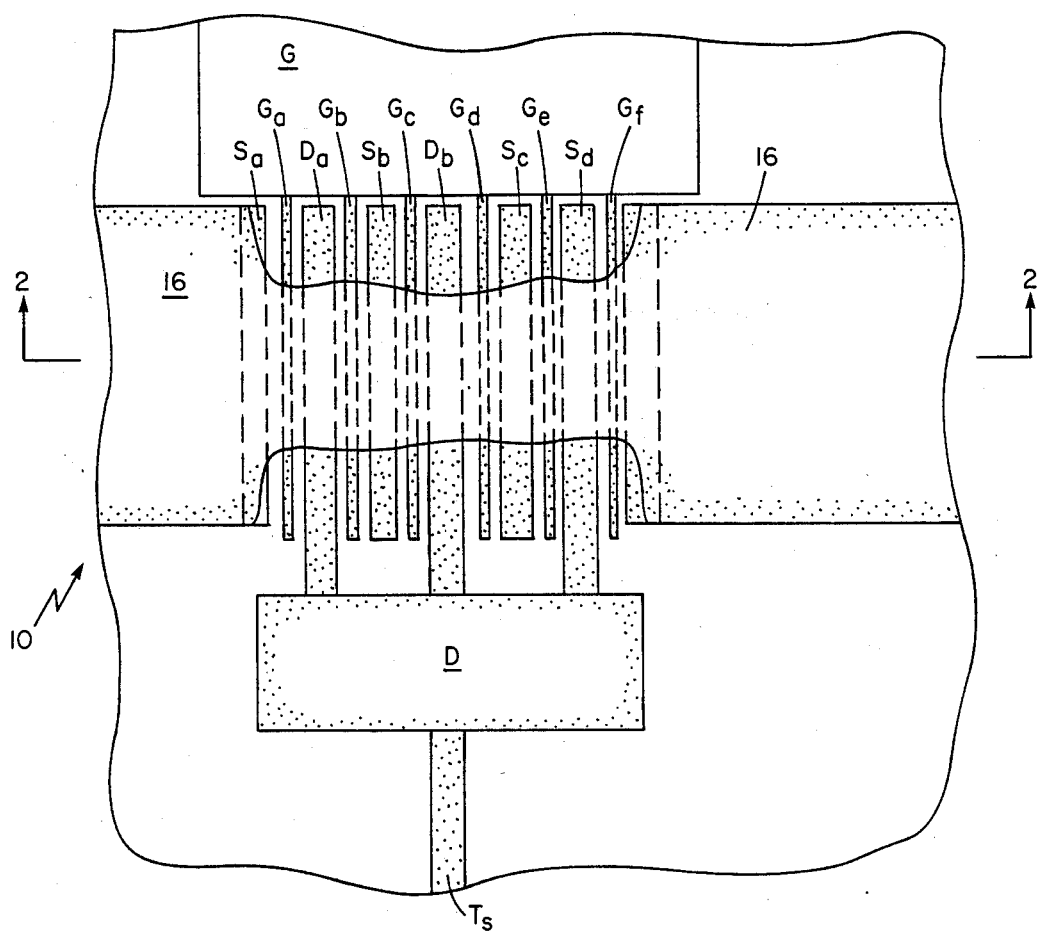
FIG. 1 is a plan view of a portion of a circuit including a multicell field effect transistor having a source overlay.
Figure 2:
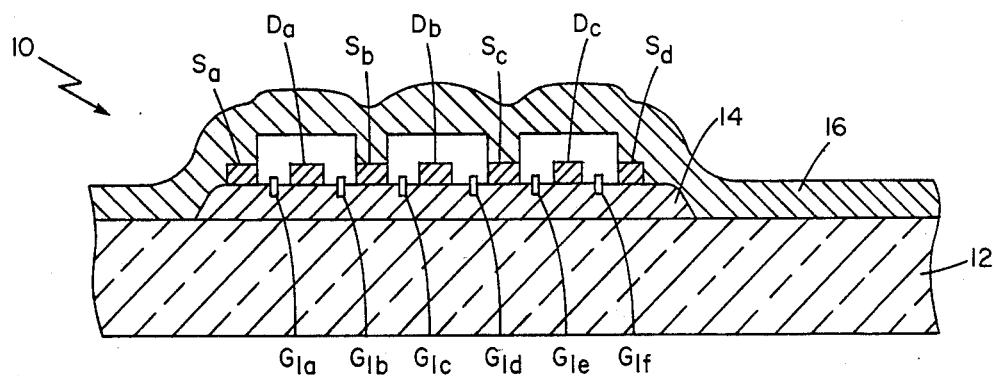
FIG. 2 is a cross-sectional view of the transistor taking along lines 2—2 of FIG. 1.

Referring now to FIGS. 1 and 2, a field effect transistor is shown to include a plurality of source regions $S_a$-$S_d$ interconnected via a common source overlay 16, a plurality of drain regions $D_a$-$D_c$ interconnected to a common drain pad D, and a plurality of gate electrode fingers $G_a$-$G_f$ interconnected to a common gate pad G and disposed to space respective ones of source and drain regions, as shown. Drain pad D is connected to a strip conductor Ts which forms part of a microstrip transmission line. The field effect transistor further includes an active region 14 here an epitaxially grown, etched mesa region, suitable doped here N-type over which drain and source electrodes are provided in ohmic contact and the gate electrodes are provided in Schottky barrier contact. Other types of active regions such as an ion implanted region may also be used. The electrodes and active layers are supported by a substrate 12 here also of gallium arsenide. Substrate 12 also provides support for portions of the source overlay 16 and strip conductor $T_s$. Source overlay 16 is to be interconnected to a ground plane conductor disposed on an opposite surface of the substrate 12 through a via hole, as will be described. The substrate 12 being semi-insulating also provides the dielectric for the microstrip transmission line (not numbered) formed by the strip conductor $T_s$ and the ground plane conductor, as will be described. Transistor 10 dissipates heat during operation which results in an increase in the temperature of the region disposed between source and drain electrodes. It is desirable, therefore, to efficiently remove the dissipated heat from this transistor to reduce changes in electrical properties of the device and prevent premature device failure.

Steps in the fabrication of first and second recesses in the substrate 12 with each one of said recesses having different depths to provide a via hole through the substrate and a tub structure underlying the transistor, partially through the substrate, will now be described in conjunction with FIGS. 3-3C.

Figure 3A:
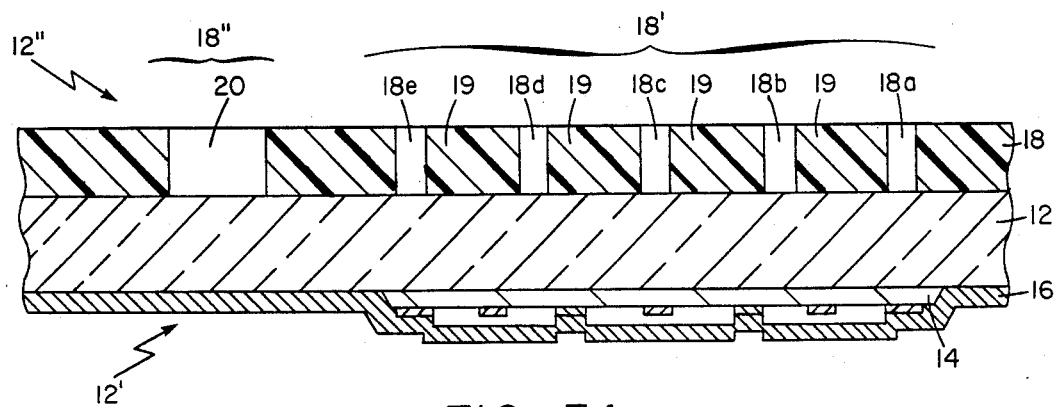
FIGS. 3A-3C are a series of cross-sectional views of the circuit, as generally shown in FIG. 2 in accordance with a first aspect of the present invention.
Figure 7A:
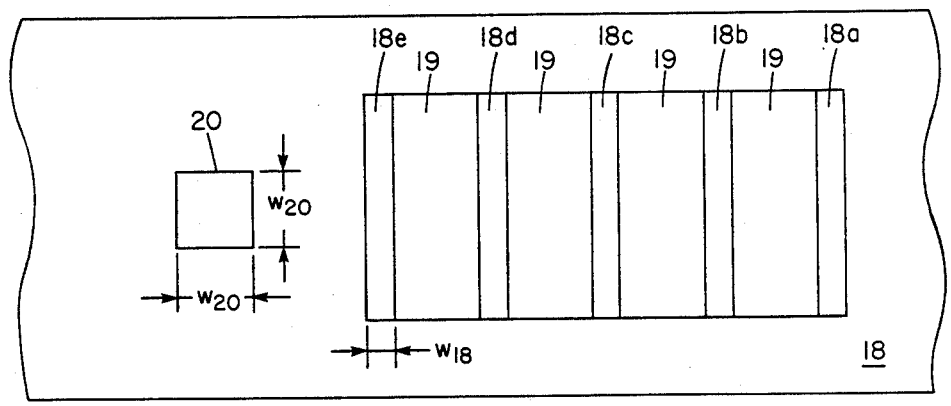
FIGS. 7A-7B are a series of plan views of masking patterns for simultaneous etching of tub and vias in accordance with the invention.
Figure 7B:
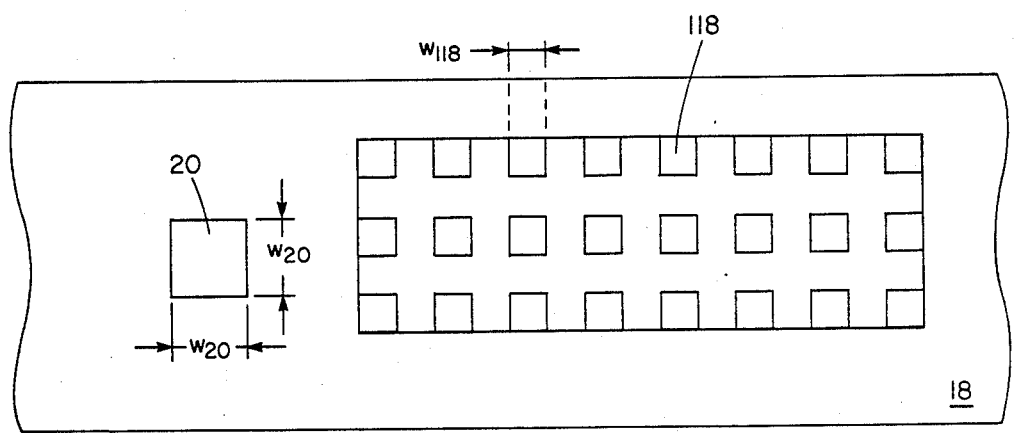

Referring first to FIG. 3A, a frontside 12' of the substrate (i.e. the side of the substrate having the transistor 10 disposed thereon) is mounted on a conventional carrier used in photolithographic processing (not shown) and embedded in a protective material such as a wax (not shown). A masking layer here of photoresist 18 is deposited over a backside 12" of the substrate 12 and is patterned in selective regions to provide a first patterned region 18' comprised of a plurality of slots 18a-18c which selectively expose underlying portions of the substrate 12, and which are regularly spaced by regions 19, as shown in FIG. 3A and also FIG. 7A. During formation of the first mask region 18', a second mask region 18" is also formed, here comprised of a single slot or square aperture 20 which selectively exposes an underlying portion of the substrate 12. Alternatively, the region 18' may be patterned to provide a plurality of apertures 118 such as squares, as shown in FIG. 7B. The width $w_{118}$ of here square apertures are chosen in conjunction with $w_{20}$ to provide the desired penetration of the pattern during etching of the substrate 12. Here region 18' comprised of the plurality of relatively narrow slots will be etched to form a recessed tub structure underlying the transistor 10, and region 18" comprised of here a single relatively large slot or alternative a plurality of relatively large wide slots will be etched to provide a via hole completely through the substrate 12. That is, the cross-sectional dimensions of the slots 18a-18c and aperture 20 are chosen such that the dimension of aperture 20 are substantially larger than those of slots 18a-18e, as will be further described.

Figure 3B:
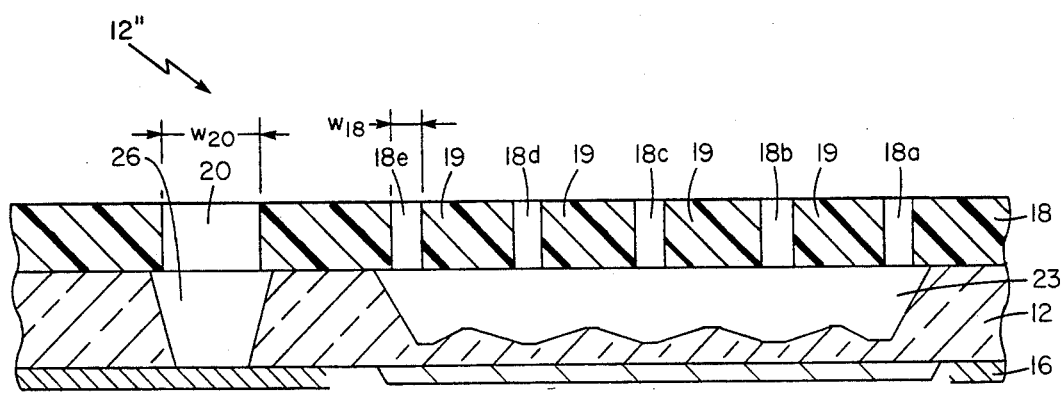

Referring now to FIG. 3B, an etchant is brought into contact with the exposed portions of the substrate 12 and the patterns in the masking layer 18 are transferred to the substrate, as shown. The etchant here a "Freon-12" (trademark for $CCl_2F_2$) plasma remains in contact with the substrate here until the via hole 26 formed from the patterned region 18" is etched completely through the substrate 12. During this period, the recessed portion 22 (i.e. tub structure for the field effect transistor disposed on the front side of the substrate) is etched to a depth less than completely through the substrate.

Here, the slot dimensions i.e. the width $w_{18}$ of the slots 18a-18e of region 18' are chosen in relation to the width $w_{20}$ of the aperture 20 in region 18" such that the slots 18a-18e etched at a selected fraction of the etch rate as a function of depth of the aperture 20 of pattern 18". Typically, when the via is a square pattern and the tub is a plurality long slots, the width of the via $w_{20}$ is from 4 to 6 times the width of the slots. Here the slots etch at about 60% to 70% of the rate of slot 20. The separation provided by masked region 19 between the slots 18a-18e is chosen as is the etch conditions such that a predetermined amount of undercut of the slot patterns occurs (i.e. a predetermined aspect ratio) during etching of the substrate so that the etched slots overlap and form a somewhat more uniform surface at the desired depth of the tub. However, after the etching of the tub is completed, the bottom surface will be characterized as an irregular surface due to the incomplete overlap of the slots 18a-18e. That is, the tub structure may be seen as being formed by merging or bring together a series of slots provided in the patterned masking region 18' through selective undercut of the substrate 12 during the etching of the substrate 12.

Figure 8:
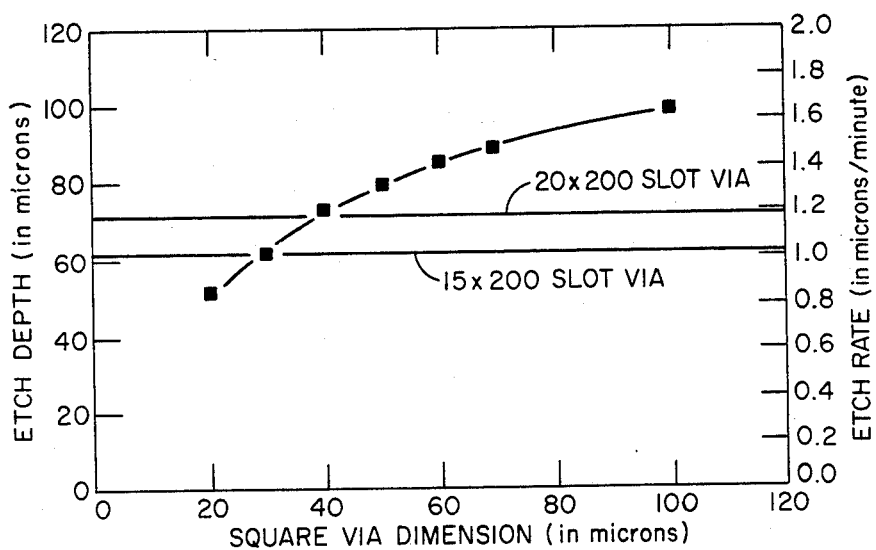
FIG. 8 is a plot of etch rate as a function of feature size.

Considerations which are used in selection of the slot width and spacing between the slots include the type of etchant and the ultimately desired size of the via and depth of the tub. For example, FIG. 8 shows a relationship between the etch rate and etch depth as a function of a square via dimension for a 60 min. 'Freon-12' plasma etchant. Thus, a via 100 microns × 100 microns, in combination with 20 microns × × 200 micron slot dimensions would provide after etching a via completely through the substrate 12 and a tub etched about 72% through the substrate. If the 15 × 200 slot dimensions were chosen, the tub would have been etched about 62% through the substrate. Longer or shorter etch times, different slot dimensions, and different via aperture square dimensions may be used to provide different relationship between via size and tub depth. Further, photoresist support is increased for a pattern as shown in FIG. 7B allowing for relatively large tub structures to be easily fabricated. The aspect ratio (i.e. slope of the sidewalls) is typically chosen to be between 1:3 to 1:5 and is controlled by varying the plasma etching conditions such as pressure and energy.

Figure 3C:
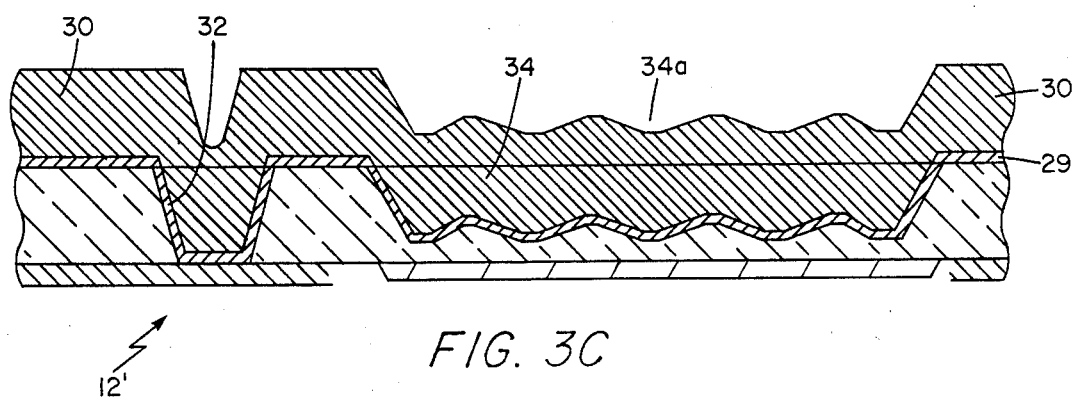

Referring now to FIG. 3C, after the photoresist layer 18 has been removed from the substrate 12, a conventional heat sink/ground plane conductive layer 30 is then formed over the etched via hole, tub recess and remainder of the backside 12" of the substrate 12. The ground plane conductive layer 30 may be formed by electrolessly plating the backside of the substrate 12 by exposing the GaAs to a palladium containing solution to provide a thin layer 29 of palladium over the substrate 12. Such a solution known as Techni Electroless Palladium by Techni Inc. Cranston, R.I. may be used. The palladium layer 29 will provide a continuous conductive surface which then may be electrically plated using conventional techniques to provide a conductive layer 30 having a predetermined thickness of typically 0.5 mils. Since the backside of the substrate and the etched portions of the backside of the substrate are plated simultaneously after simultaneous formation of the tub and via structures, the pattern in the tub structures and via holes will be replicated on the backside of the substrate as shown. In order to alleviate this problem, when the substrate is mounted on the carrier solder is allowed to freely flow to fill the voids 34a in the replicated pattern in the conductive ground plane 30.

Referring now to FIGS. 4A-4E, steps in the simultaneous fabrication of via hole and tub structures and a process to provide a backside surface of the substrate having a substantially uniform thickness will now be described.

Figure 4A:
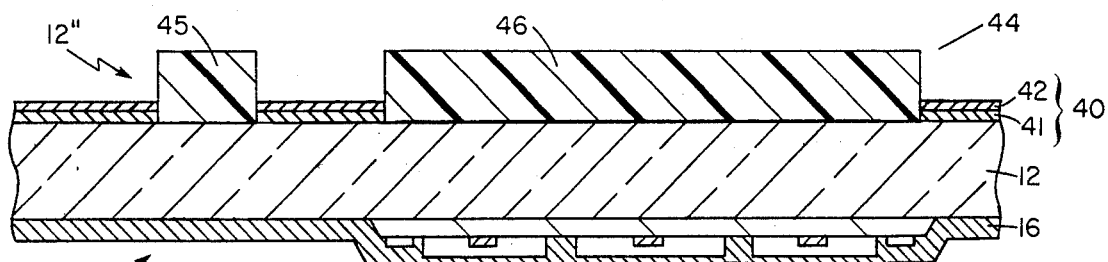
FIGS. 4A-4E are a series of cross-sectional views in accordance with a second aspect of the present invention.

Referring now to FIG. 4A, a masking layer of photoresist is disposed over the backside of the substrate 12 and is patterned in selective regions to provide regions 45 and 46 of photoresist, which mask the regions where via holes and tub structures, respectively, are to be provided. After formation of masked regions layers 45 and 46, a continuous conductive layer 40 is provided over unmasked portions of the backside of the substrate 12. The continuous conductive layer 40 comprises a layer 41 here of electrolessly plated palladium and a layer 42 here of electroplated gold. The electrolessly plated palladium layer 41 is provided by contacting bare gallium arsenide i.e. the unmasked portions of the backside of the substrate with a solution containing palladium, as mentioned above. The palladium containing solution reacts with the gallium arsenide forming a thin surface layer over the bare gallium arsenide having a thickness in the order of 100-1000 A. The gold conductive layer 42 is then electroplated over the palladium to a thickness of about 1,000 to 20,000 A. Accordingly, a continuous conductive layer 40 having a thickness of about 1,000 to 20,000 A is selectively provided over the back surface of the substrate. After the continuous conductive coating layer 40 is provided over the substrate, the photoresist regions 45 and 46 are stripped away using conventional techniques leaving apertures (not shown) in the conductive layer 40 corresponding to the location for tub structures and via holes.

As shown in FIG. 4A, the continuous conductive layer 40 is exaggerated in thickness to better illustrate this feature. However, it is to be understood that in practice, the conductive coating layer 40 is a relatively thin layer.

Figure 4B:
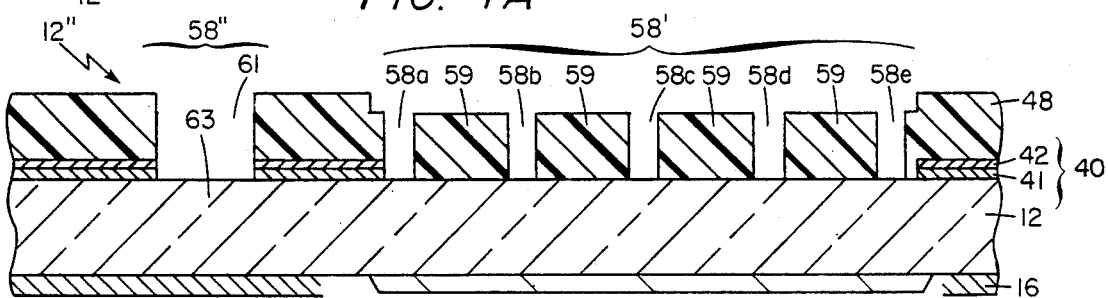

Referring now to FIG. 4B, a second photoresist layer 48 is disposed over the continuous conductive coating 40 and exposed regions of the gallium arsenide. The photoresist layer 48 is patterned in selective regions in a single photolithographic step to provide a first pattern region 58' and a second pattern region 58'' in the locations for tub structures and via holes, respectively. The pattern provided in region 58' includes a plurality of slots 58a-58e separated by a plurality of regions of photoresist 59 which expose underlying portions of the gallium arsenide. The pattern provided in region 58'' here comprises a single slot 61. The patterns provided in photoresist layer 48 are selected, however to overlap or to cover end surfaces of the continuous conductive coating and thereby completely isolate the continuous conductive coating from the etchant used to etch the wafer in a manner to be described.

Figure 4C:
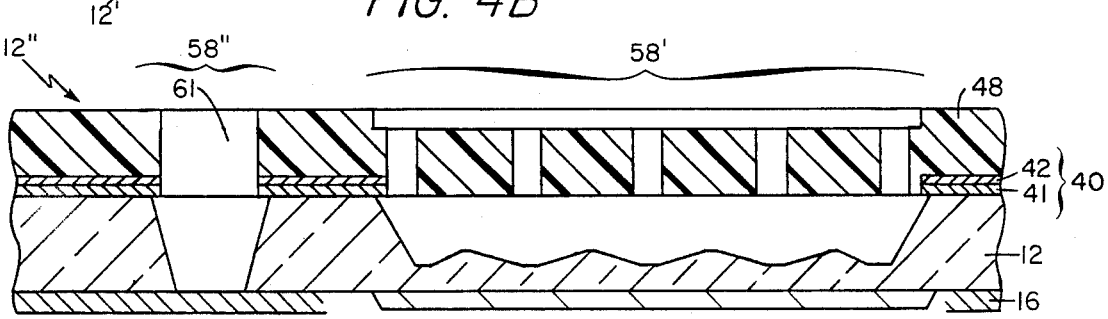

Referring now to FIG. 4C, the tub structures and via holes are simultaneously etched into the backside of the substrate 12 using similar criteria as described in conjunction with FIG. 3B. Here a "Freon-12" (trademark) $CCl_2F_2$ plasma etchant is used as in FIG. 3B. The etch conditions are selected such that the apertures 63 and 64 provided in the substrate 12 slightly undercut the continuous conductive coating layer 40, as shown. The etch conditions are further chosen such that the apertures have an aspect ratio of 3:1 to 5:1 here 4:1 so that the series of slots 58a-58e merge to form the tub, as previously described.

Figure 4D:
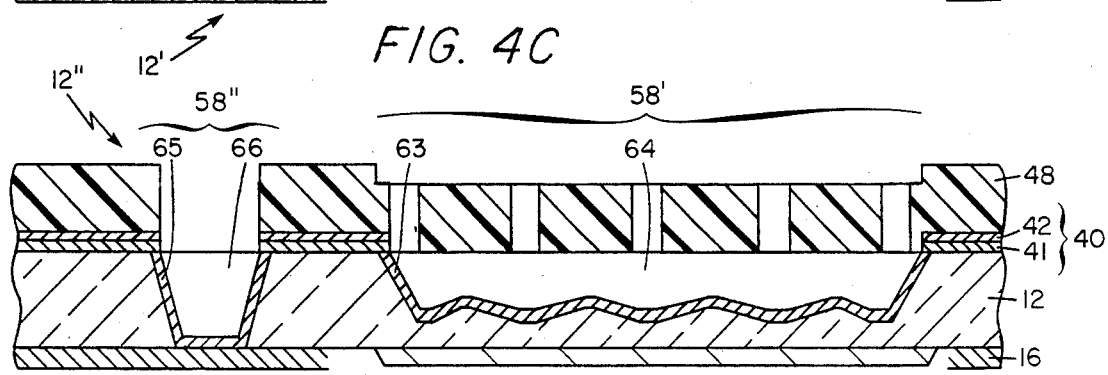

Referring now to FIG. 4D, the substrate is disposed in a solution containing palladium to electrolessly plate palladium on exposed surfaces of gallium arsenide, forming continuous conductive layers 63 and 66 in the tub 64 and via hole 65, respectively, as shown, with said layers formed in electrical contact with layer 40.

Figure 4E:
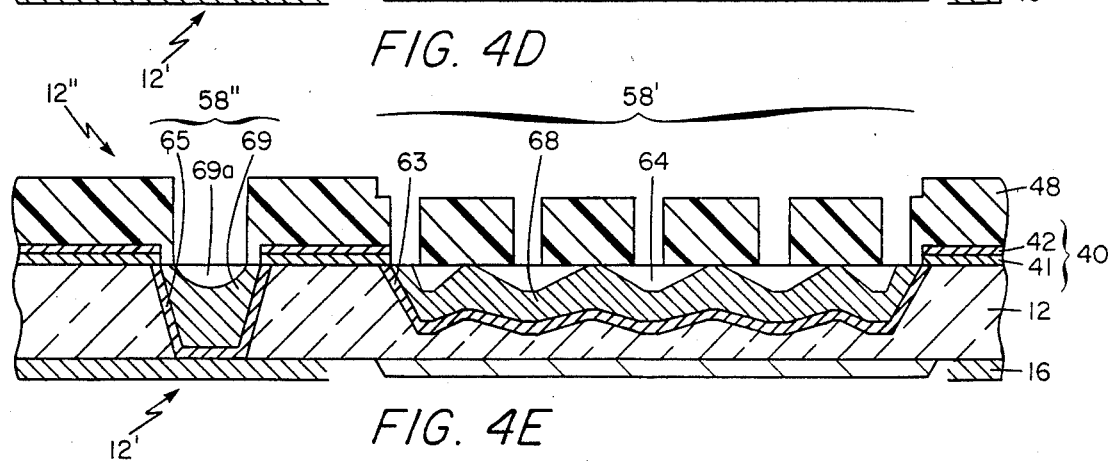

Referring now to FIG. 4E, the substrate 12 having the continuous conductive layers 63 and 66 in the tub 64 and via 65 is electroplated with a conductive material such as gold to provide a thick deposit 68 of conductive material within the tub structure 64, and an electrical contact deposit 69 in the via. Therefore, the conductive material is plated until a solid deposit, substantially coplanar with the backside of the substrate is formed in the tub prior to the point where the plating material will envelope the resist. Due to the differences in depth between the tub and via and the topography of the tub, a small surface void 69a may be present in the via, and smaller surface voids 68a may be present in the deposit formed in the tub. However, since substantially most of the heat conduction from the transistor is through the tub structure, the via hole deposit 69 need only be in electrical contact with the backside of the wafer.

After the deposits 69, 68 of metal are provided in the via hole and tub structure, the photoresist layer 58 is removed, and a conventional relatively thick layer of gold 0.5 mil thick typically is provided over the backside 12'' of the substrate to form a heat sink/ground plane for the substrate 12.

Figure 5A:
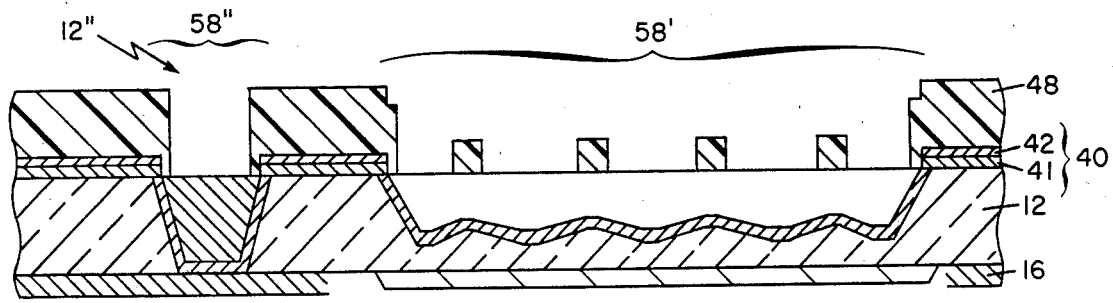
FIGS. 5A-5B are a series of cross-sectional views in accordance with a third aspect of the present invention.
Figure 5B:
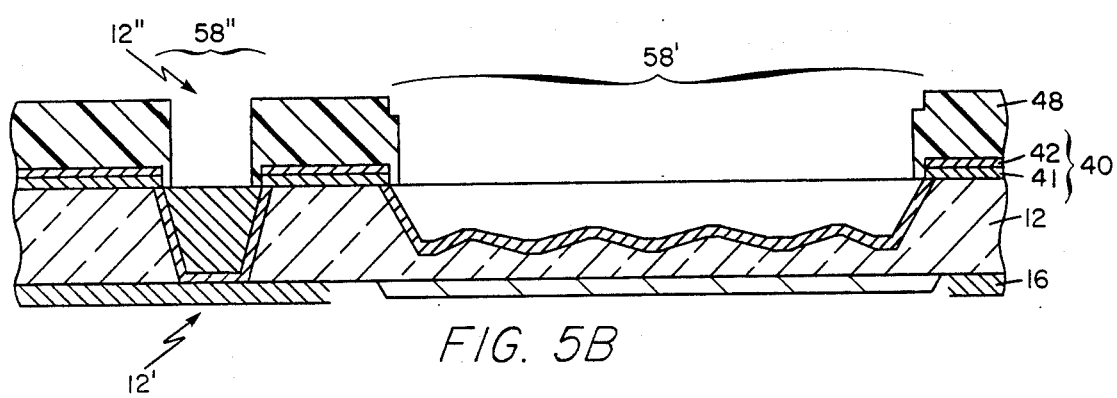

In order to aid with the process of simultaneously plating the via hole and tub structure generally described above in conjunction with FIGS. 4A-4E, it may be helpful to increase the size of the apertures 58a-58e provided in the masking layer 58. The size of the aperture 58a-58e may be increased before or after electrolessly plating the via hole and tub apertures with palladium. This may be accomplished by an additional bake out of the resist at an elevated temperature to weaken and thereby remove portions the photoresist regions 59 which space the slots 58a-58e, as shown in FIG. 5A or completely remove the regions 59, as shown in FIG. 5B. Alternatively, as shown here and in FIG. 4A-4E, a double exposure of the masking layer 48 is used to provide selective weakness of the resist layer and the step in the resist pattern in the tub region. Returning to the step as shown in FIG. 4B, the resist layer 48 is patterned with a first exposure which exposes the tub and via structures completely, and a second exposure which exposes the patterned slots and via. The exposure conditions are chosen such that the complete tub exposure only sensitizes a part of the depth of the resist thus permitting it to be further patterned by the slotted pattern shown in FIG. 4B. After development, the photoresist is weakened however in the region 59 between the slots and may be eroded away for the subsequent plating steps. By employing this particular step, for example, the electroplating solution will enter the tub structure substantially uninhibited, and thus, more quickly and more easily plate the tub structure.

Figure 6:
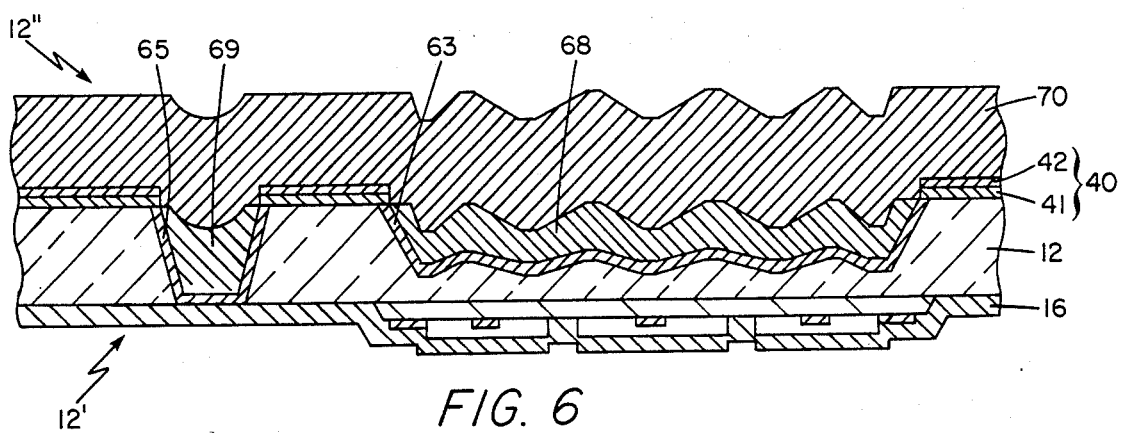
FIG. 6 is a cross-sectional view showing the circuit having a via hole and a tub structure with a thick plated conductive layer.

As shown in FIG. 6, the backside surface of the substrate is then provided with a conventional heat sink/ground plane conductive layer 70 plated to a thickness of typically 0.5 mil. This is accomplished by removing resist layer 58 and plating over the continuous conductive layer 40.

Having described preferred embodiments of the invention, it will now become apparent to one of the skill in the art that other embodiments incorporating their concepts may be used. It is felt, therefore, that these embodiments should not be limited to disclosed embodiments, but rather should be limited only to by the spirit and scope of the appended claims.

What is claimed is:

1. A semiconductor circuit comprises:
   a semiconductor substrate supporting a heat dissipating device formed over a first surface thereof;
   a conductive backplane formed over a second opposite surface of said semiconductor substrate;
   a conductive contact disposed through said semiconductor substrate provided to make electrical contact between a conductor disposed over the first surface of said semiconductor substrate and the conductive backplane disposed over the second surface of said semiconductor substrate; and
   a thermally conductive region disposed in a recess provided partially into said semiconductor substrate in a region thereof underlying said heat dissipating element, with said recess having an irregular, nonplanar surface adjacent said heat dissipating element, and said thermally conductive material being disposed in thermal contact with said heat dissipating element and the conductive backplane disposed on the semiconductor substrate.

2. The circuit of claim 1 wherein the heat dissipating device is a field effect transistor.

3. The circuit of claim 2 wherein the substrate comprises gallium arsenide.

4. A semiconductor circuit comprising a semiconductor substrate having a pair of recesses of different depths disposed in a common, first surface of said substrate, with at least one of said recesses disposed partially through said substrate and having an irregular, nonplanar bottom surface.

5. The semiconductor circuit of claim 4 further comprising a field effect transistor formed over a second surface of said substrate in a region thereof disposed over the recess having the irregular, nonplanar surface.

6. The semiconductor circuit of claim 4 further comprising:
- a conductive layer disposed over said first surface of said substrate having the pair of recesses; and
- a pair of deposits of conductive material each disposed in one of said pair of recesses with said conductive layer disposed in thermal contact with each of said pair of deposits.

* * * * *